(12) United States Patent
Ho et al.

(10) Patent No.: US 8,987,824 B2
(45) Date of Patent: Mar. 24, 2015

(54) MULTI-GATE SEMICONDUCTOR DEVICES

(75) Inventors: Jon-Hsu Ho, New Taipei (TW); Chih-Ching Wang, Jinhu Township (TW); Ching-Fang Huang, Taipei (TW); Wen-Hsing Hsieh, Taichung (TW); Tsung-Hsing Yu, Taipei (TW); Yi-Ming Sheu, Hsinchu (TW); Chih-Chieh Yeh, Taipei (TW); Ken-Ichi Goto, Hsin-Chu (TW); Zhiqiang Wu, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 210 days.

(21) Appl. No.: 13/301,873

(22) Filed: Nov. 22, 2011

(65) Prior Publication Data
US 2013/0126981 A1 May 23, 2013

(51) Int. Cl.
| H01L 27/12 | (2006.01) |
| H01L 27/092 | (2006.01) |
| H01L 29/78 | (2006.01) |
| H01L 29/10 | (2006.01) |

(52) U.S. Cl.
CPC ........ H01L 27/0924 (2013.01); H01L 29/7831 (2013.01); H01L 29/785 (2013.01); H01L 29/105 (2013.01)
USPC ........................................................ 257/351

(58) Field of Classification Search
None
See application file for complete search history.

(56) References Cited

U.S. PATENT DOCUMENTS

| 8,264,032 | B2 * | 9/2012 | Yeh et al. ........................ 257/327 |
| 8,623,716 | B2 * | 1/2014 | Wang et al. ..................... 438/157 |
| 2002/0011612 | A1 * | 1/2002 | Hieda .............................. 257/262 |
| 2004/0256683 | A1 * | 12/2004 | Lee et al. ........................ 257/412 |
| 2006/0094194 | A1 * | 5/2006 | Chen et al. ..................... 438/301 |
| 2009/0184369 | A1 * | 7/2009 | Zhu ................................. 257/347 |
| 2009/0309167 | A1 * | 12/2009 | Russ et al. ...................... 257/370 |
| 2010/0163927 | A1 * | 7/2010 | Pillarisetty et al. ............ 257/194 |
| 2011/0042748 | A1 * | 2/2011 | Anderson et al. .............. 257/365 |

* cited by examiner

*Primary Examiner* — Benjamin Sandvik
(74) *Attorney, Agent, or Firm* — Duane Morris LLP

(57) ABSTRACT

A multi-gate semiconductor device is formed including a semiconductor substrate. The multi-gate semiconductor device also includes a first transistor including a first fin portion extending above the semiconductor substrate. The first transistor has a first channel region formed therein. The first channel region includes a first channel region portion doped at a first concentration of a first dopant type and a second channel region portion doped at a second concentration of the first dopant type. The second concentration is higher than the first concentration. The first transistor further includes a first gate electrode layer formed over the first channel region. The first gate electrode layer may be of a second dopant type. The first dopant type may be N-type and the second dopant type may be P-type. The second channel region portion may be formed over the first channel region portion.

20 Claims, 14 Drawing Sheets

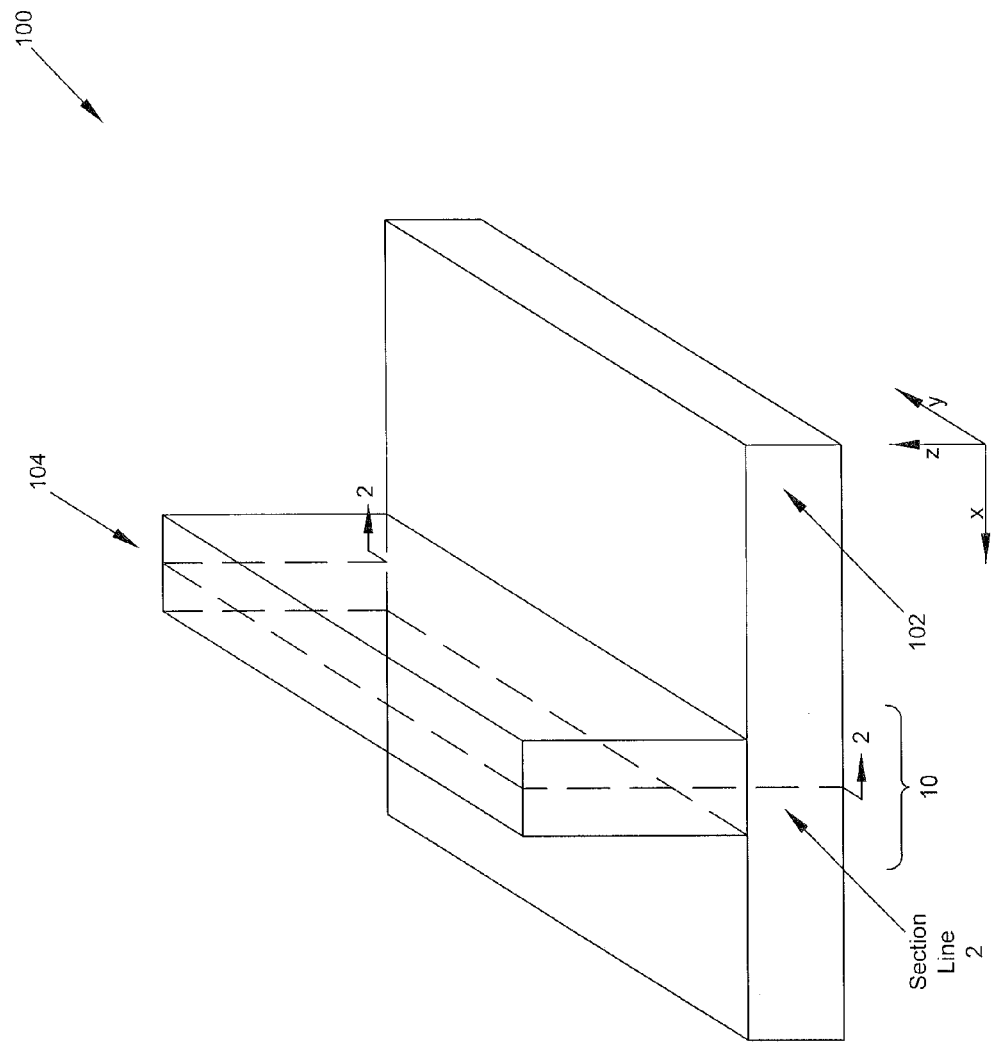

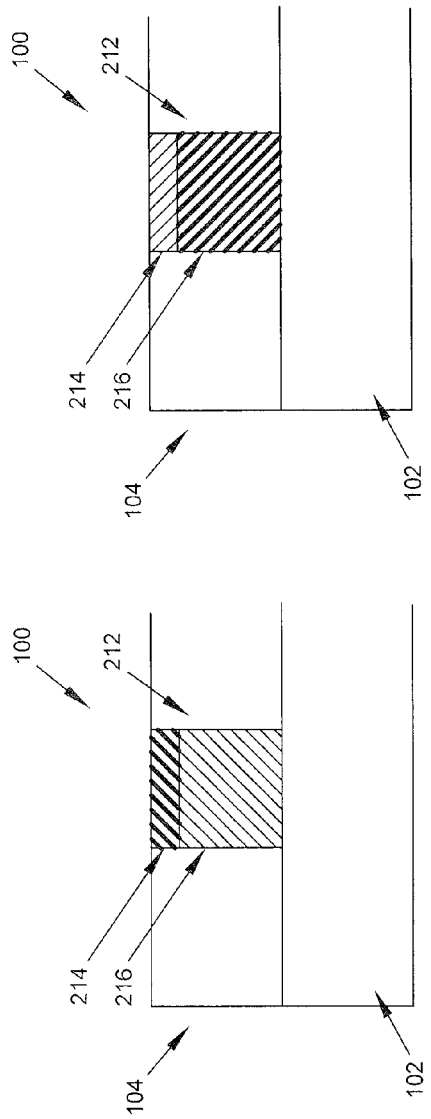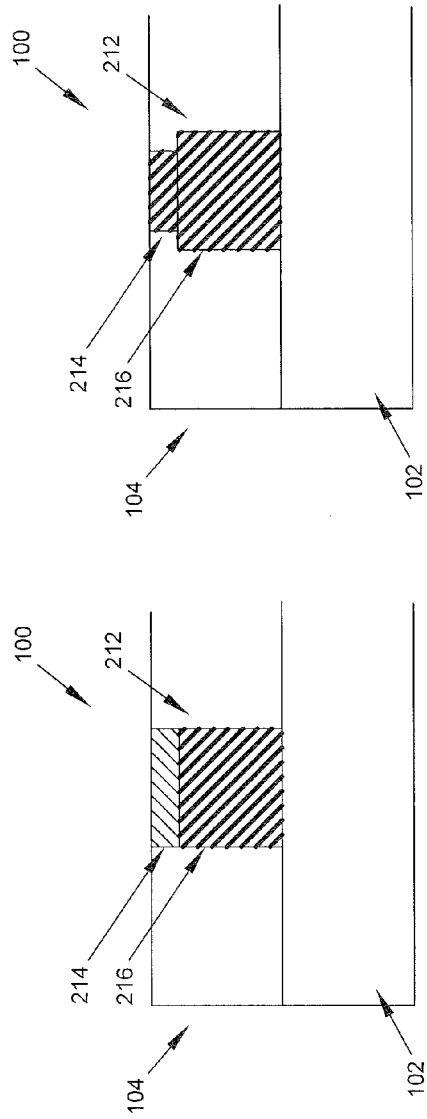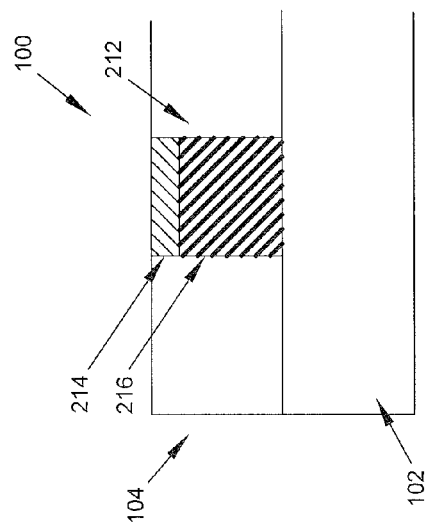

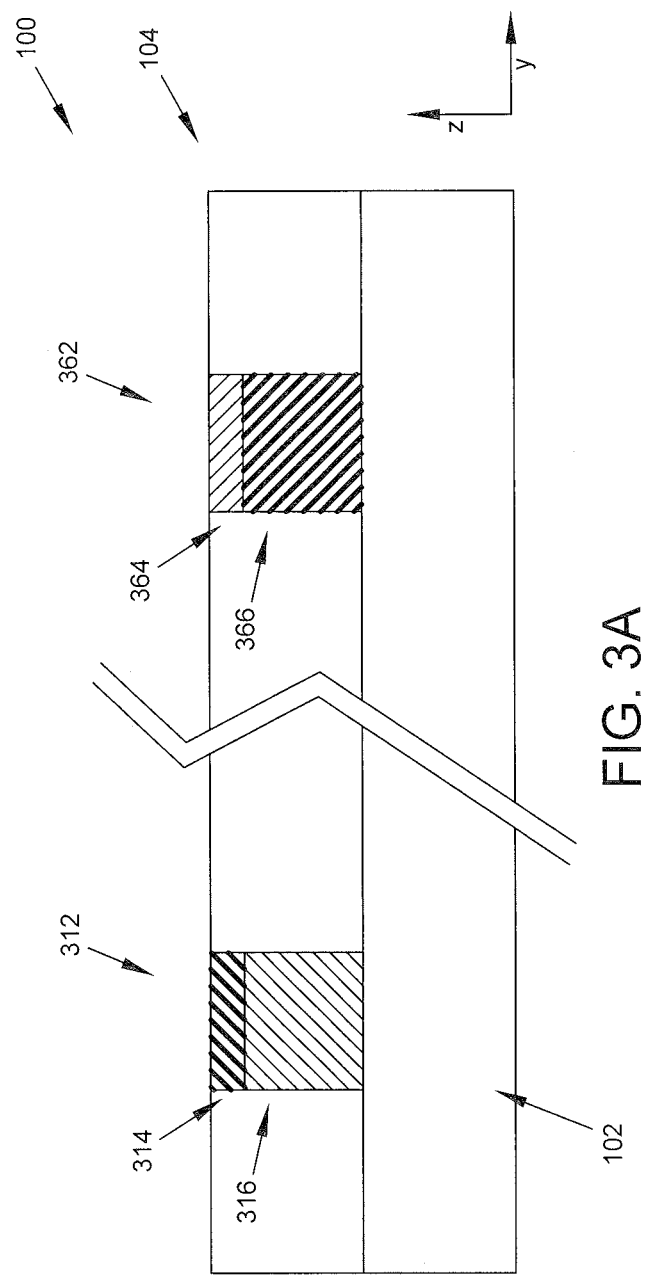

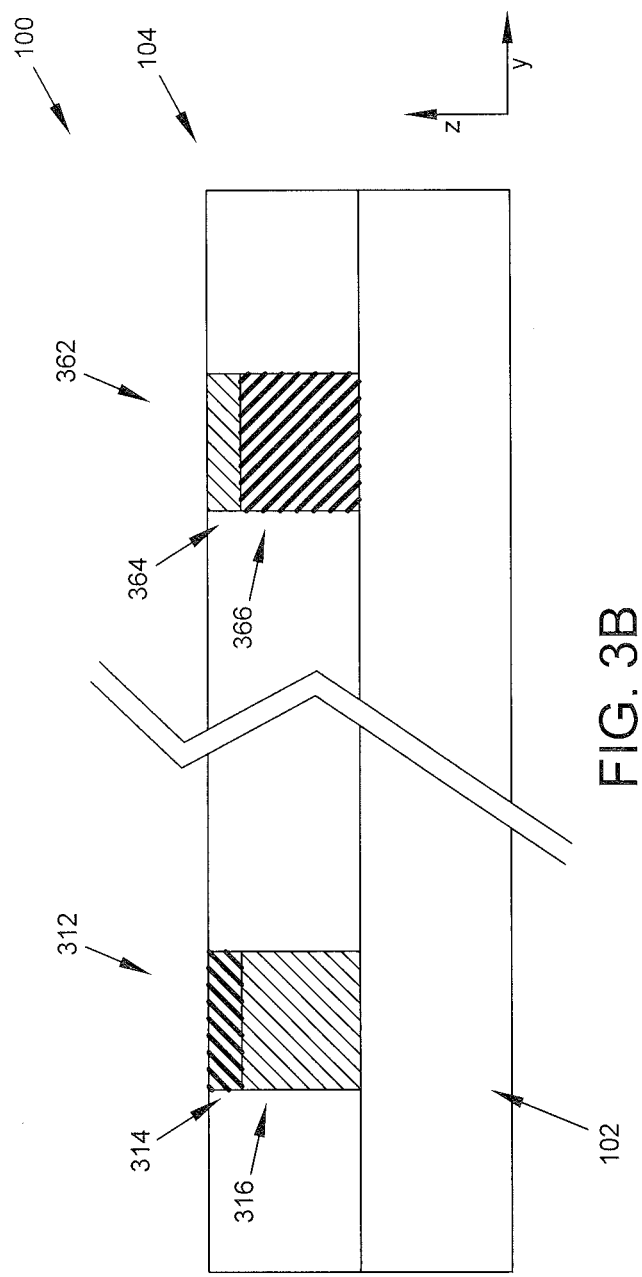

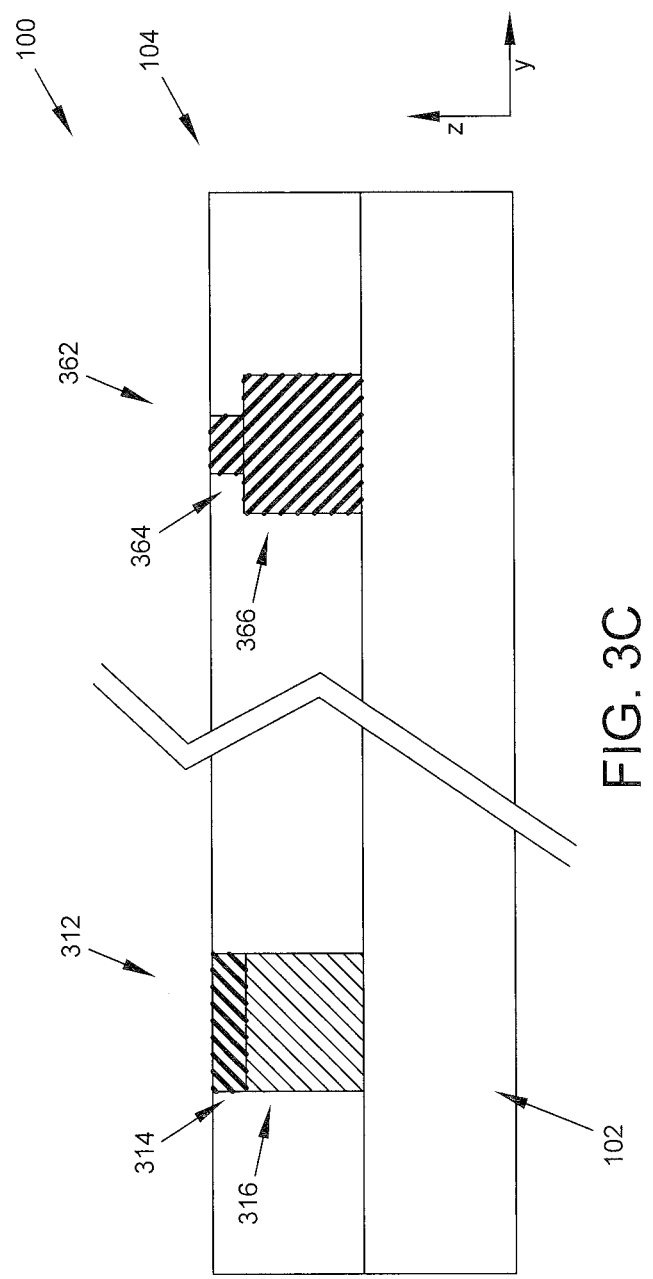

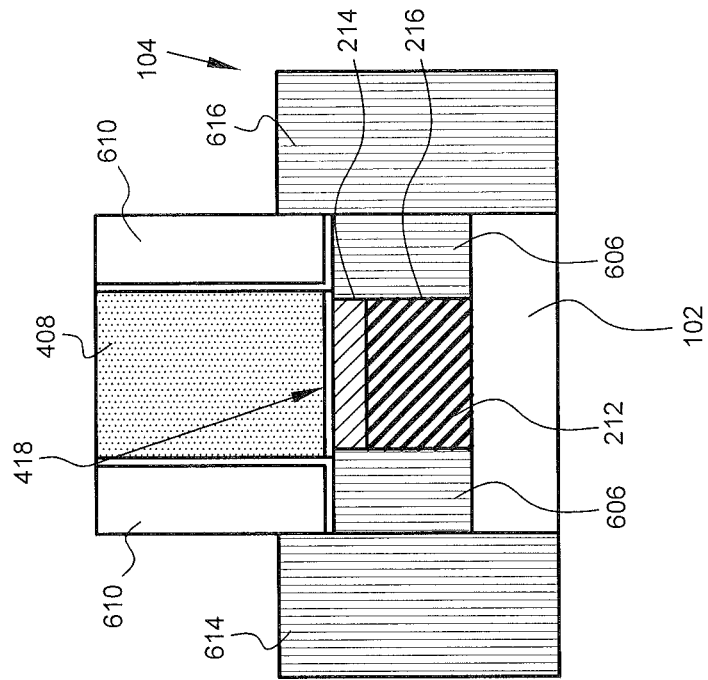
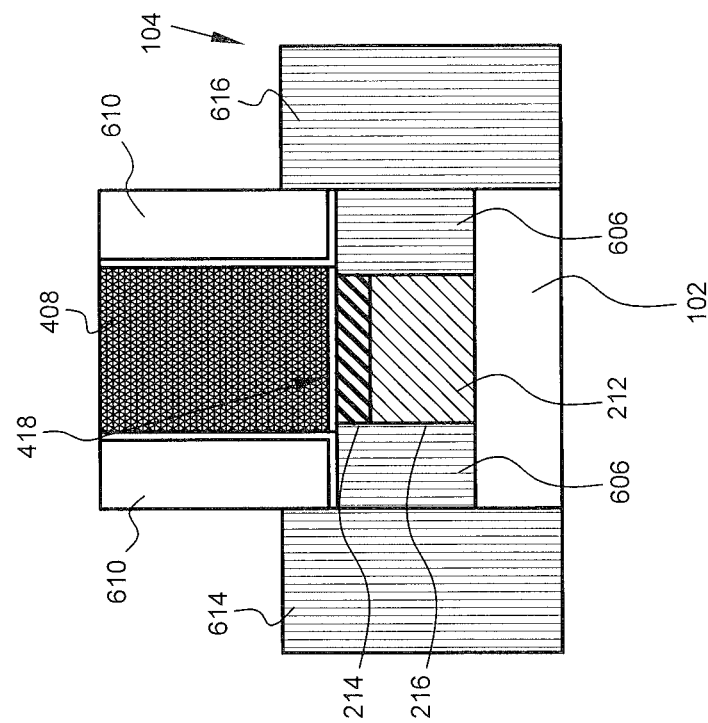

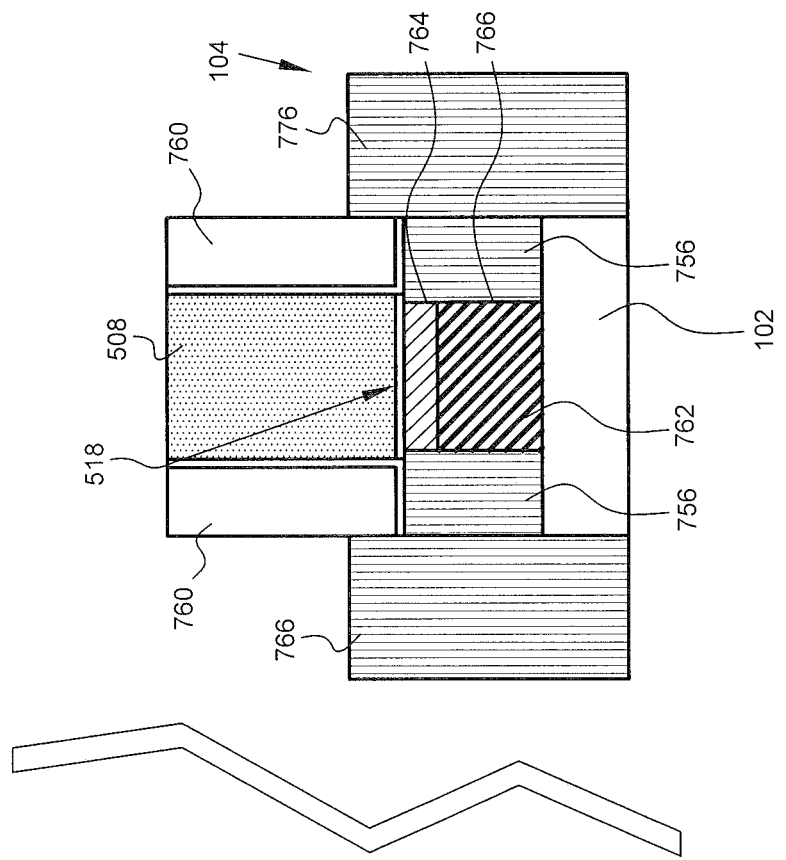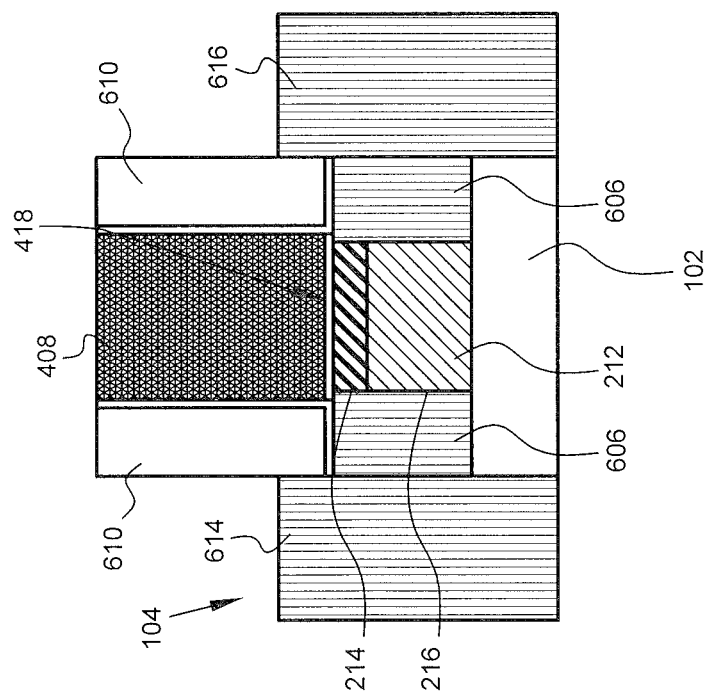
FIG. 7A

MULTI-GATE SEMICONDUCTOR DEVICES

FIELD OF THE INVENTION

The present disclosure is directed generally to multi-gate semiconductor devices and more particularly to FinFETs.

DESCRIPTION OF THE RELATED ART

Multi-gate semiconductor devices, such as FinFETs, are being considered for many logic and other applications in the semiconductor manufacturing industry and are integrated into various different types of semiconductor devices. In FinFETs, gates are typically formed over and along the sides of semiconductor fins and take advantage of the increased surface area of the channel and source/drain regions formed in the fins to produce faster, more reliable and better controlled semiconductor transistor devices.

While fabricating multi-gate devices, the leakage current observed along a cross-section of the FinFET is non-uniform and includes localized hot spots. This non-uniformity in the FinFET leakage current profile, and localized hot spots, degrades performance of the FinFET and results in poor gate control characteristics and higher drain induced barrier loading.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

FIG. 1 illustrates an isometric view of a semiconductor device showing different cross-section directions for FIGS. 2A-2C and 3A-3C.

FIGS. 2A-2D are cross-sectional views of a semiconductor device according to some embodiments of the present disclosure.

FIGS. 3A-3C are cross-sectional views of a semiconductor device according to some embodiments of the present disclosure.

FIGS. 6A-6C are cross-sectional views of a multi-gate semiconductor device according to some embodiments of the present disclosure.

FIGS. 7A-7C are cross-sectional views of a multi-gate semiconductor device according to some embodiments of the present disclosure.

DETAILED DESCRIPTION OF THE EXAMPLES

Figure 4:
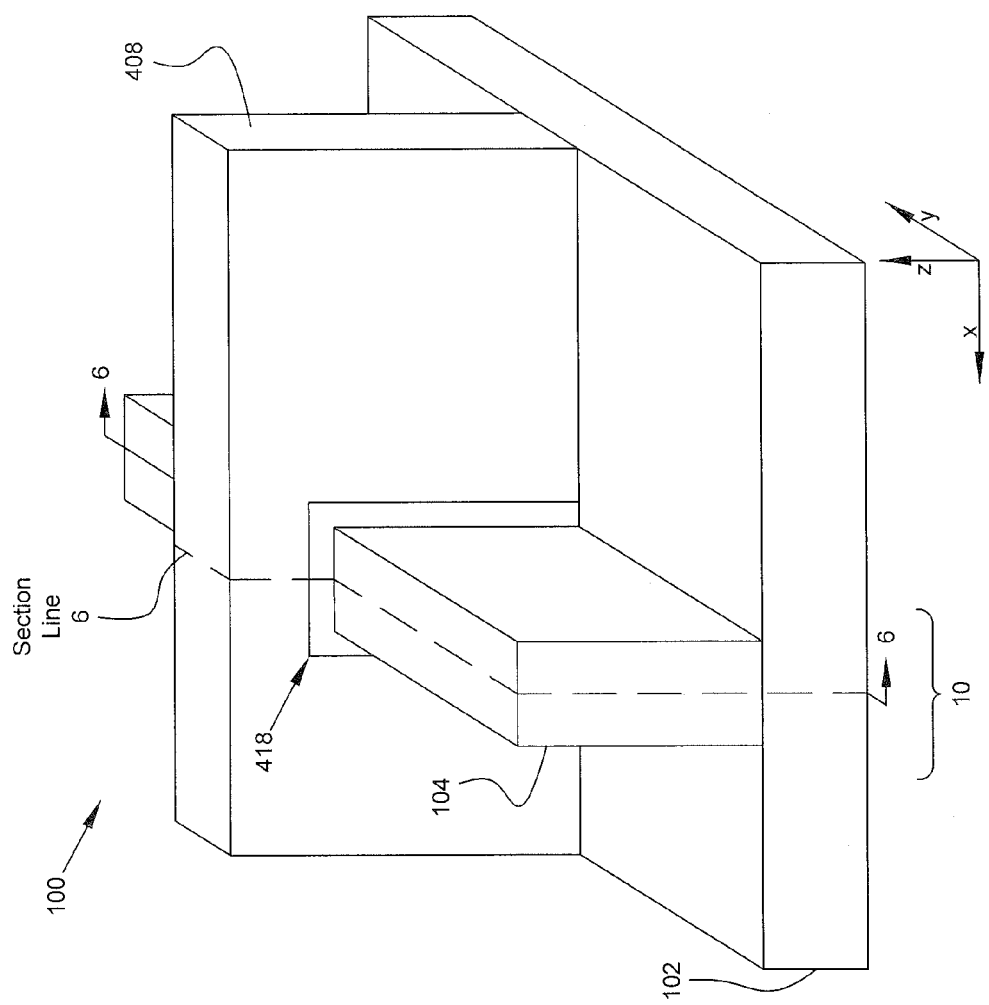
FIG. 4 illustrates an isometric view of a multi-gate semiconductor device showing different cross-section directions for FIGS. 6A-6C and 7A-7C.

An improved multi-gate semiconductor device is described below, with improved device performance for single work function and dual work function devices. The multi-gate semiconductor device fabrication processes described herein may be performed using any suitable commercially available equipment commonly used in the art to manufacture multi-gate semiconductor devices, or alternatively, using future developed equipment.

Multi-gate semiconductor devices have been observed to control channel-concentration to reduce leakage current and improve device performance. However, while fabricating such devices, leakage current along a cross section of the device (e.g. from top to bottom along a cross section of a FinFET) has been observed to have a non-uniform profile including localized leakage current hot spots. The inventors have observed that optimization of the channel region dopant concentration profile is an effective mechanism to improve metal-oxide semiconductor (MOS) transistor performance and that also minimizes the cost and impact on subsequent processing steps. Specifically, the inventors have observed that optimization of the channel region dopant concentration profile results in the elimination of localized hot spots and a more uniform leakage current profile along a cross section of the transistor, compared to an otherwise similar finFET having a uniform dopant concentration. A more uniform leakage current profile results in a transistor operating closer to more ideal current to voltage (I-V) characteristics. Better gate control and improved drain induced barrier lowering (DIBL) is achieved by creating a more uniform leakage current profile. The inventors have observed that improved device performance is achieved for dual work function and single work function devices.

With reference to the Figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Those skilled in the art will recognize that many changes can be made to the embodiments described herein while still obtaining beneficial results. It will also be apparent that some of the desired benefits discussed below can be obtained by selecting some of the features or steps discussed herein without utilizing other features or steps. Accordingly, those who work in the art will recognize that many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, various features and benefits are illustrated by reference to the exemplary embodiments. Accordingly, the subject matter of this disclosure and the appended claims are expressly not limited to such preferred embodiments.

As used herein, use of a singular article such as "a," "an" and "the" is not intended to exclude pluralities of the article's object unless the context clearly and unambiguously dictates otherwise.

With reference now to FIG. 1, an isometric schematic view of the formation of an integrated circuit structure is illustrated showing different cross-section directions for FIGS. 2 and 3. In FIG. 1, the integrated circuit structure includes a part 100 of a wafer, which includes a semiconductor substrate 102. Semiconductor substrate 102 may be a bulk silicon substrate, a bulk silicon germanium (SiGe) substrate, a Group III-V compound substrate, or a substrate formed of other suitable materials. Substrate 102 may be doped with a p-type or an n-type impurity. One or more isolation regions, such as shallow trench isolation (STI) regions (not shown) may be formed in or over substrate 102. A semiconductor fin 104 is formed extending above the substrate 102. In some embodiments, fin 104 is formed above a top surface of the one or more STI regions (not shown). Substrate 102 includes a doped region 10. As shown, Fin 104 is formed over the doped region 10. In some embodiments, doped region 10 has N type impurities. In other embodiments, doped region 10 has P type impurities.

Semiconductor fin 104 may be formed by any suitable method. In some embodiments, semiconductor fin 104 may be formed by forming one or more STI regions (not shown) first, and then recessing the top surface of the one or more STI regions (not shown) to a level lower than the original top surface of substrate 102. The remaining portion of substrate 102 adjacent to the one or more STI regions (not shown) thus become fins 104. For example, substrate 102 may be patterned and etched through a photolithographic process. In some embodiments, semiconductor fin 104 is formed from a material different from that of substrate 102. Fin 104 can be formed by recessing a top portion of substrate 102 between neighboring STI regions (not shown) to form a recess, and re-growing a semiconductor material different from that of substrate 102 in the recess. A top portion of an STI region (not shown) may then be removed, while a bottom portion of the STI region (not shown) is not removed, so that the top portion of the re-grown semiconductor material between neighboring STI regions (not shown) become a semiconductor fin. In another embodiment, STI regions (not shown) may be formed by a process including recess formation on substrate 102, forming a dielectric film using a chemical vapor deposition (CVD) process, then using chemical metal polishing (CMP) to remove extra STI dielectric film. Fin 104 may then be formed and patterned through an epitaxial growth process.

Semiconductor fin 104 has a channel region formed therein. The channel region may be formed from any suitable material including, but not limited to Ge, SiGe or a III-V semiconductor material. Semiconductor fin 104 may have channel region dopants introduced by any suitable method. For example, channel region dopants may be introduced through implantations, or through in-situ doping performed simultaneously with the growth of semiconductor fin 104. The inventors have discovered that by selecting the geometric configuration of the channel region and the substrate/channel-epitaxial, channel/well-implants, lightly doped drain (LDD)/halo-implants/epitaxial materials, an optimum and more uniform leakage current profile can be achieved in a multi-gate device to improve MOS transistor performance.

FIGS. 2A-2D are cross-sectional views of a semiconductor device according to some examples of embodiments of the present disclosure. With reference now to FIG. 2A, a cross-sectional view of a part of device 100 and a portion of fin 104 taken along the section line 2 of FIG. 1 according to an embodiment is illustrated. As shown, p-type dopants are introduced into channel region 212 at a first portion of fin 104. Any suitable p-type dopant may be introduced. For example, a p-type impurity such as boron may be implanted into channel region 212. As shown, the lower channel region portion 216 is doped at a first concentration and the upper channel region portion 214 is doped at a second concentration. The first and second concentrations are not the same as to each other. As shown, the first concentration is higher than the second concentration. In some embodiments, channel region portions 214 and 216 may be doped at concentrations between approximately 0 and approximately 4E18 charge carriers per cubic centimeter In an exemplary embodiment, the difference in concentration between the first concentration and the second concentration is approximately $2e^{18}$ charge carriers per cubic centimeter (e.g. between $1.9e^{18}$ and $2.1e^{18}$ charge carriers per cubic centimeter.) For example, channel region portion 214 may be doped at a concentration of 1E17 charge carriers per cubic centimeter and channel region portion 216 may be doped at a concentration of 2E18 charge carriers per cubic centimeter. As shown, channel region portions 214, 216 have a substantially uniform gate length. Substrate 102 may be doped with P type impurities.

FIG. 2B is a cross-sectional view of a device 100 and a portion of fin 104 taken along the section line 2 of FIG. 1 according to another embodiment. As shown, n-type dopants are introduced into channel region 212 at a first portion of fin 104. Any suitable n-type dopant may be introduced. For example, a n-type impurity such as arsenic or phosphorous may be implanted into channel region 212. As shown, the lower channel region portion 216 is doped at a first concentration and the upper channel region portion 214 is doped at a second concentration. The first and second concentrations are not the same. As shown, the first concentration is lower than the second concentration. In some embodiments, channel region portions 214 and 216 may be doped at concentrations between approximately 0 and 4E18 charge carriers per cubic centimeter (e.g. between 0 and 4.2E18 charge carriers per cubic centimeter.) In an exemplary embodiment, the difference in concentration between the first concentration and the second concentration is approximately $2e^{18}$ charge carriers per cubic centimeter (e.g. between $1.9e^{18}$ and $2.1e^{18}$ charge carriers per cubic centimeter.) For example, channel region portion 214 may be doped at a concentration of 2E18 charge carriers per cubic centimeter and channel region portion 216 may be doped at a concentration of 1E17 charge carriers per cubic centimeter. As shown, channel region portions 214, 216 have a substantially uniform gate length. Substrate 102 may be doped with P type impurities.

FIG. 2C is a cross-sectional view of a device 100 and a portion of fin 104 taken along the section line 2 of FIG. 1 according to a further embodiment. As shown, both p-type and n-type dopants are introduced into channel region 212 at a first portion of fin 104. Any suitable p-type and n-type dopant may be introduced. As shown, the lower channel region portion 216 is p-type doped at a first concentration and the upper channel region portion 214 is n-type doped at a second concentration. As shown, the first concentration in the lower channel region 216 is higher than the second concentration in the upper channel region 214. In some embodiments, channel region portions 214 and 216 may be doped at concentrations between approximately 0 and 4E18 charge carriers per cubic centimeter (e.g. between 0 and 4.2E18 charge carriers per cubic centimeter.) In the illustrated embodiment, channel region portions 214, 216 have a substantially uniform gate length. Substrate 102 may be doped with P type impurities.

FIG. 2D is a cross-sectional view of a device 100 and a portion of fin 104 taken along the section line 2 of FIG. 1 according to another embodiment. FIG. 2D shows a non-limiting example of a geometric configuration of channel region 212 that the inventors have observed results in the elimination of hot spots and an optimum and more uniform leakage current profile in a multi-gate device. However, this example is illustrative only and is not intended to limit the scope of the disclosure. It will be apparent to one skilled in the art that various modifications and variations can be made to the geometric configuration of the channel region without departing from the spirit or scope of the present subject matter. As illustrated in FIG. 2D, p-type dopants are introduced into channel region 212 at a first portion of fin 104. Any suitable p-type dopant may be introduced. In the illustrated embodiment, the upper channel region portion 214 and lower channel region portion 216 are doped at an approximately uniform concentration. In some embodiments, channel region portions 214, 216 of channel region 212 may be doped at a concentration between approximately 0 and 4E18 charge carriers per cubic centimeter. (e.g. between 0 and 4.2E18 charge carriers per cubic centimeter.) As shown, the upper channel region portion 214 and the lower channel region portion 216 have different gate lengths. In the illustrated embodiment, the upper channel region portion 214 has a shorter gate length than the lower channel region portion 216. Substrate 102 may be doped with P type impurities.

The embodiments shown in FIGS. 2A-2C and described above can be applied to both NMOS and PMOS. For example, FIGS. 3A-3C are cross-sectional views of a multi-gate semiconductor device formed in a similar manner to that shown and described at FIGS. 2A-2C by interchanging the type of dopants introduced.

FIG. 4 shows an isometric view of the formation of a finFET structure 100 and illustrates a cross-section direction for FIGS. 6 and 7. In FIG. 4, the integrated circuit structure includes a semiconductor substrate 102, which can be a portion of a wafer, or part of a singulated die. Gate electrode layer 408 is deposited above doped region 10 and over semiconductor fin 104. Gate electrode layer 408 is formed over channel region 212 (FIG. 2) (312, FIG. 3). Gate electrode layer 408 may be formed by any suitable method including, for example, PVD ("physical vapor deposition"), CVD ("chemical vapor deposition"), or ALD ("atomic layer deposition"). CVD and ALD may use an organometallic or halide precursor, and a reducing atmosphere. One or more isolation regions, such as STI regions (not shown) may be formed in or over substrate 102 and adjacent to fin 104. Substrate 102 may be doped with N type or P type impurities.

As identified above, by optimizing the channel region dopant concentration profile for the respective channel regions of each of the transistors of a multi-gate semiconductor device, such as a FinFET, localized hot spots may be eliminated and a more uniform leakage current profile along a cross section of the transistor may be achieved. A more uniform leakage current profile results in a transistor operating closer to more ideal current to voltage (I-V) characteristics. Better gate control and lower DIBL is also achieved by creating a more uniform leakage current profile. The inventors have observed that improved device performance is achieved for dual work function and single work function devices. Such improvements have been observed in many types of voltage threshold (VT) devices, such as uLVT, LVT, SVT, HVT and uHVT, with minimal impact on cost and subsequent processing steps. In some embodiments, gate dielectric layer 418 may be deposited above dopant region 10 and over semiconductor fin 104. In some embodiments, gate dielectric layer 418 is formed of a dielectric material. The dielectric material may include aluminum-containing dielectrics, such as $Al_2O_3$, HfAlO, HfAlON, AlZrO, Hf-containing materials, such as $HfO_2$, $HfSiO_x$, $HfAlO_x$, $HfZrSiO_x$, HfSiON, other materials such as $LaAlO_3$ and $ZrO_2$ and/or any other suitable material. Gate dielectric layer 418 may be formed by any suitable method. In the illustrated embodiment, gate electrode layer 408 is formed on gate dielectric layer 418 in dopant region 10 and over semiconductor fin 104. In some embodiments, gate electrode layer 408 may be deposited over channel region 212 (FIG. 2) (312, FIG. 3). In another embodiment, gate electrode layer 408 and gate dielectric layer 418 may be patterned to form gate stacks (not shown) over semiconductor fin 104. Semiconductor fin 104 may have fin portions that are uncovered by the gate stacks (not shown). In some embodiments, dopants may be introduced into the exposed portions of semiconductor fin 104 to form doped source and drain regions.

In some embodiments where the dopants introduced into channel region portions 214, 216 (314, 316, 364, 366) are n-type dopants, gate electrode layer 408 may be formed from any suitable p-type metal including, but not limited to, Ru ("ruthenium"), Pd ("palladium"), Pt ("Platinum"), Co ("cobalt"), Ni ("nickel"), TiAlN ("titanium aluminum nitride"), or WCN ("tungsten carbon nitride"). In another embodiment, where the dopants introduced into channel region portions 214, 216 (314, 316, 364, 366) are p-type dopants, gate electrode layer 408 may be formed from any suitable n-type metal including, but not limited to, Hf, Zr, Ti, Ta, or Al. In a further embodiment, where the dopants introduced into channel region portions 216 (316, 366) are p-type dopants and the dopants introduced into channel region portions 214 (314, 364) are n-type dopants, gate electrode layer 408 may be formed from any suitable n-type metal.

Figure 5:
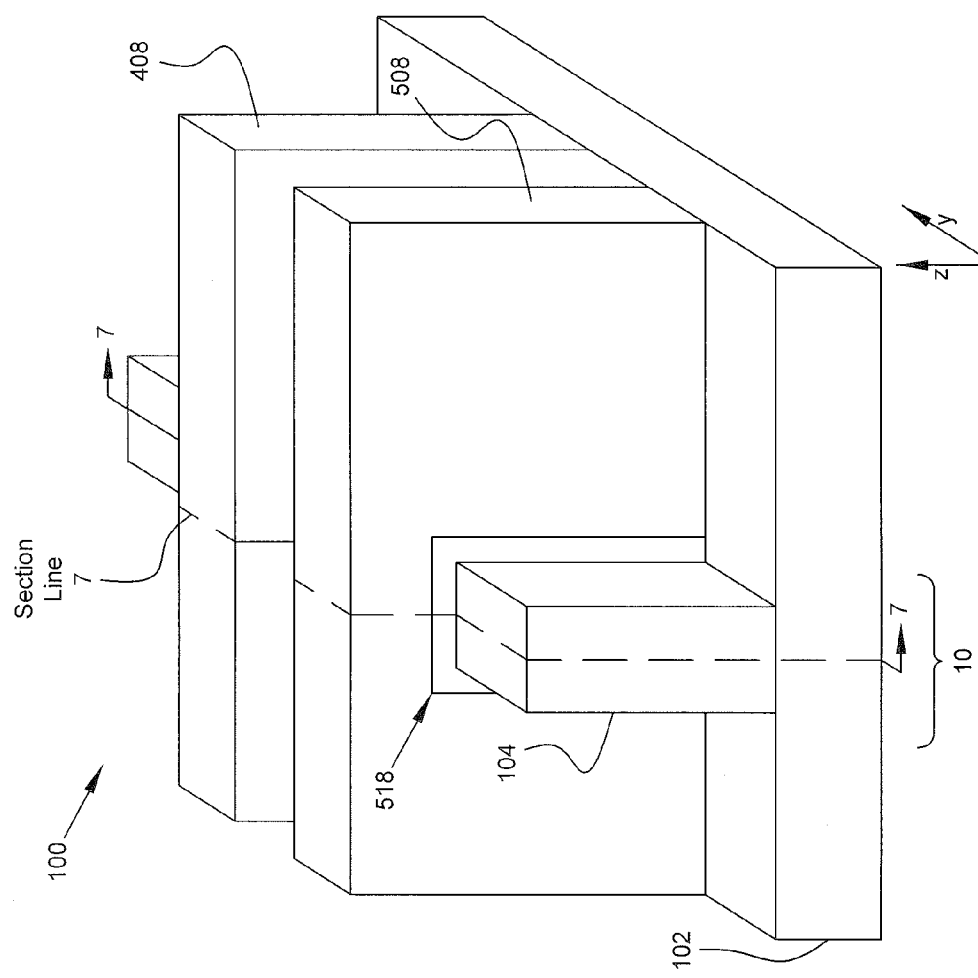
FIG. 5 illustrates an isometric view of a multi-gate semiconductor device showing different cross-section directions for FIGS. 7A-7C.

FIG. 5 shows a perspective view of the formation of a multigate finFET structure 100 and illustrates cross-section directions for FIG. 7. In FIG. 5, the integrated circuit structure includes a semiconductor substrate 102, which may be a part of a wafer, or part of a singulated die. Gate electrode layers 408 and 508 are deposited above dopant region 10 and over semiconductor fin 104. One or more isolation regions, such as STI regions (not shown) may be formed in or over substrate 102 and adjacent fins 104. In some embodiments, gate electrode layer 408 may be deposited over channel region 212 (FIG. 2) and channel region 312 (FIG. 3) and gate electrode layer 508 may be deposited over channel region 362 (FIG. 3). The gate electrode layers 408 and 508 may be respectively formed by any suitable method. In some embodiments, gate dielectric layers 418 and 518 may be deposited above dopant region 10 and over semiconductor fin 104. Gate dielectric layers 418 and 518 may be formed by any suitable method. In the illustrated embodiment, gate electrode layers 408 and 508 are respectively formed on gate dielectric layers 418 and 518 in dopant region 10 and over semiconductor fin 104. In another embodiment, gate electrode layer 408 and gate dielectric layer 418 and gate electrode layer 508 and gate dielectric layer 518 may be patterned to form gate stacks (not shown) over semiconductor fin 104. Although FIG. 5 shows two gate electrodes 408, 508, one of ordinary skill understands that any desired number of gate electrodes may be included.

In some embodiments where channel regions 364, 366 are n-type doped, gate electrode layer 508 may be formed from any suitable p-type metal. In another embodiment, where channel region portions 364, 366 are p-type doped, gate electrode layer 508 may be formed from any suitable n-type metal. In a further embodiment, where channel region portion 266 is p-type doped and channel region portion 264 is n-type doped, gate electrode layer 508 may be formed from any suitable n-type metal. Substrate 102 may be doped with P type impurities.

Figure 6C:
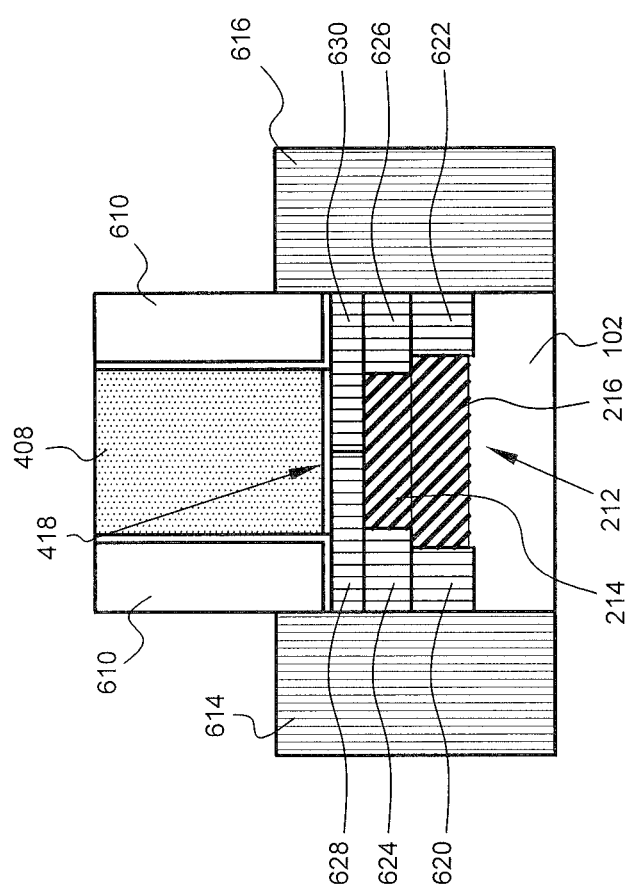

FIGS. 6A-6C are cross-sectional views of a multi-gate semiconductor device according to some embodiments of the present disclosure. FIG. 6A is a cross-sectional view of fin-FET 100 and portions of fin 104 taken along the section line 6 of FIG. 4. As shown, p-type dopants are introduced into channel region 212 at a first portion of fin 104. Any suitable p-type dopant may be introduced. As shown, the lower channel region portion 216 is doped at a first concentration and the upper channel region portion 214 is doped at a second concentration. The first and second concentrations are not the same as each other. As shown, the first concentration is higher than the second concentration. In some embodiments, channel region portions 214 and 216 may be doped at concentrations between approximately 0 and 4E18 charge carriers per cubic centimeter (e.g. between 0 and 4.2E18 charge carriers per cubic centimeter.) In an exemplary embodiment, the difference in concentration between the first concentration and the second concentration is approximately $2e^{18}$ charge carriers per cubic centimeter (e.g. between $1.9e^{18}$ and $2.1e^{18}$ charge carriers per cubic centimeter.) As shown, channel region portions 214, 216 have a substantially uniform gate length. The active region of substrate 102 may be implanted with P type impurities. In the illustrated embodiment, gate electrode layer 408 is formed from any suitable p-type metal. In some embodiments, the illustrated integrated circuit structure may include a first transistor including a first fin portion 104, n-type doped channel region 212 having channel region portion 214 doped at a lower concentration than channel region portion 216, gate dielectric layer 418 and n-type metal gate electrode layer 408. In some embodiments, lightly doped source 614 and drain 616 regions of fin 104 may be formed by implantation or any suitable method. In the illustrated embodiment, implantation may be performed to introduce an n-type impurity, for example, arsenic or phosphorous, to form lightly doped source 614 and drain 616 regions. Lightly doped drain (LDD) regions 606 may also be formed close to the top surface of fin 104 and along the sidewalls of channel region 212 by any suitable method as shown in FIG. 6A. Spacers 610 may be formed by any suitable method.

With reference to FIG. 6B, a cross-sectional view of fin-FET 100 and portions of fin 104 taken along the section line 6 of FIG. 4 is shown. In the illustrated embodiment, the integrated circuit structure may include a first transistor including a first fin portion 104, n-type doped channel region 212 having channel region portion 216 doped at a lower concentration than channel region portion 214, gate dielectric layer 418 and p-type metal gate electrode layer 408. In another embodiment, channel region 212 may include n-type doped channel region 214 and p-type doped channel region 216 where channel region portion 216 is doped at a higher concentration than channel region portion 214. In an exemplary embodiment, the difference in concentration between the first concentration and the second concentration is approximately $2e^{18}$ charge carriers per cubic centimeter (e.g. between $1.9e^{18}$ and $2.1e^{18}$ charge carriers per cubic centimeter.) As shown, channel region portions 214, 216 have a substantially uniform gate length. Substrate 102 may be doped with P type impurities. Lightly doped source 614 and drain 616 regions of fin 104 may be formed by implantation or any suitable method. In the illustrated embodiment, lightly doped source 614 and drain 616 regions are n-type doped. Lightly doped drain (LDD) regions 606 may also be formed close to the top surface of fin 104 and along the sidewalls of channel region 212 by any suitable method. Spacers 610 may be formed by any suitable method.

FIG. 6C is a cross-sectional view of a finFET 100 taken along the section line 6 of FIG. 4 according to another embodiment of the present disclosure. In the illustrated embodiment, the upper channel region portion 214 and lower channel region portion 216 are p-type doped at an approximately uniform concentration. In some embodiments, channel region portions 214, 216 of channel region 212 may be doped at a concentration between approximately 0 and 4E18 charge carriers per cubic centimeter (e.g. between 0 and 4.2E18 charge carriers per cubic centimeter.) As shown, the upper channel region portion 214 has a shorter gate length than the lower channel region portion 216. Substrate 102 may be doped with P type impurities. The illustrated integrated circuit structure may include a transistor including a fin portion 104, p-type doped channel region 212, gate dielectric layer 418, n-type metal gate electrode layer 408, lightly doped source 614 and drain 616 regions of fin 104, and spacers 660.

In the illustrated embodiment, the transistor further includes LDD regions of varying sizes. In some embodiments, spacers (not shown) may be formed to act as self aligned hard masks and to control the impurity levels implanted in the LDD regions. In some embodiments, the integrated circuit structure may include LDD regions 628 and 630 formed between the source 614 and drain 616 regions of fin 104 and between the channel region 212 and the gate dielectric layer 418. As shown, LDD regions 628 and 630 form a junction between source 614 and drain 616 regions and channel region 212. The integrated circuit structure may include LDD regions 624 and 626 respectively formed between source region 614 and a sidewall of channel region portion 214 and between drain region 616 and an opposing sidewall of channel region portion 214. The integrated circuit structure may further include LDD regions 620 and 622 respectively formed between source region 614 and a sidewall of channel region portion 216 and between drain region 616 and an opposing sidewall of channel region portion 216. In the illustrated embodiment, LDD regions 620 and 622 have larger gate lengths than LDD regions 624 and 626.

Figure 7B:
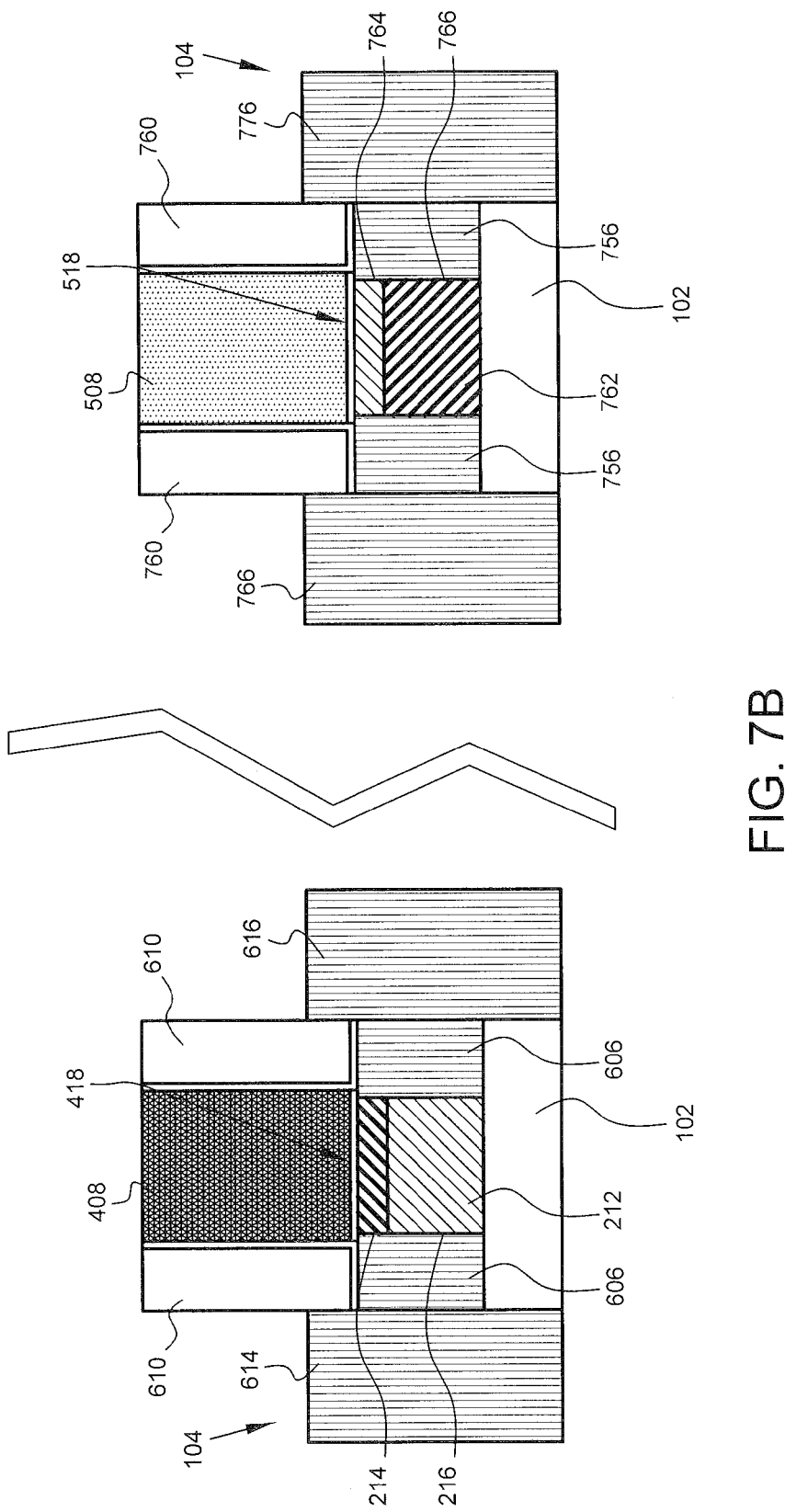
Figure 7C:
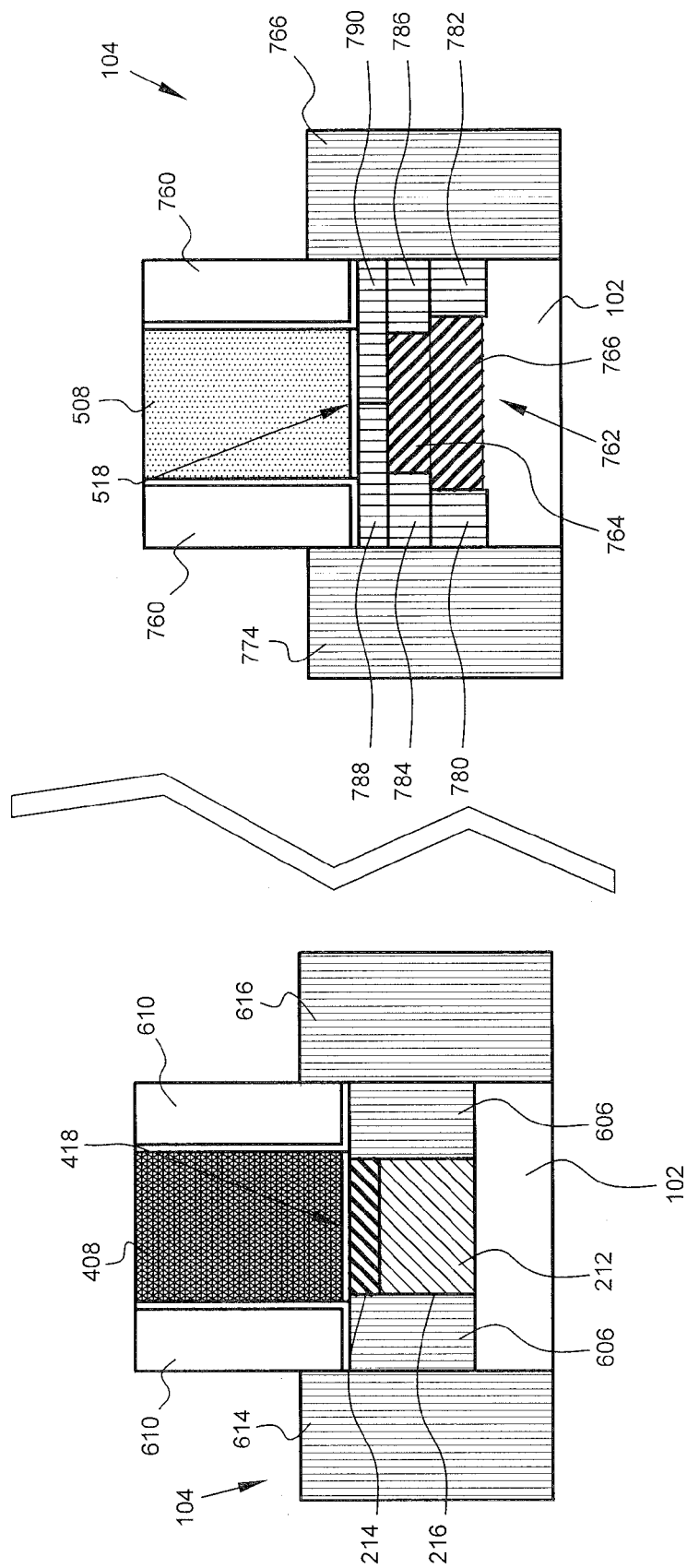

The embodiments shown in FIGS. 6A-6C and described above can be applied to both NMOS and PMOS. For example, FIGS. 7A-7C are cross-sectional views of a multi-gate semiconductor device having first and second transistors according to various embodiments and formed in a similar manner to that shown and described at FIGS. 6A-6C by interchanging the type of dopants introduced.

Figure 8:
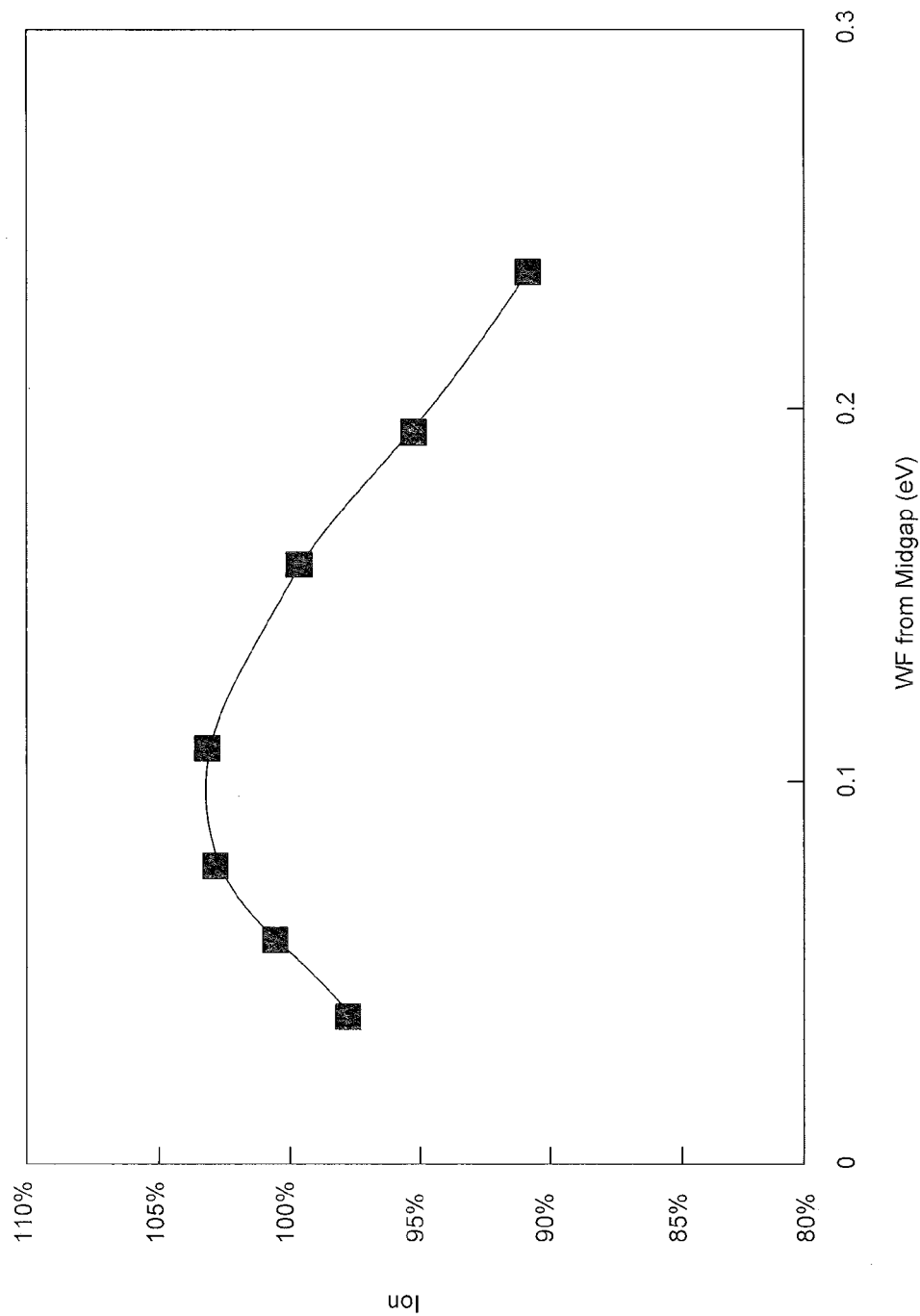
FIG. 8 is a diagram of leakage current as a function of various parameters.
Figure 9:
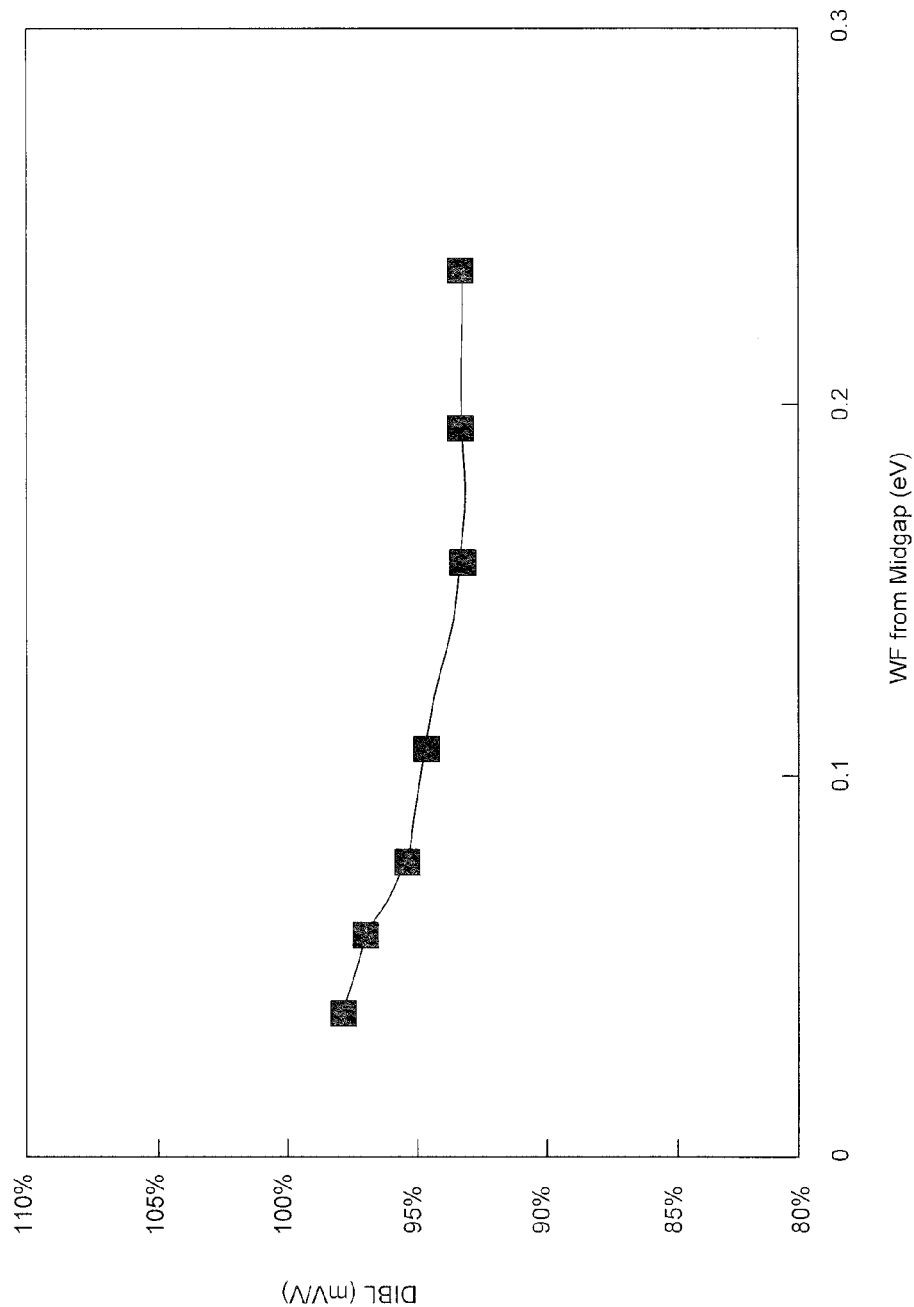
FIG. 9 is a diagram of drain induced barrier lowering as a function of various parameters.

FIGS. 8 and 9 are based on simulation data which used the conditions described herein. FIG. 8 shows the on current (as an ion percentage) as a function of work function from the midgap of the device (in electron volts ev) for four different example semiconductor devices. The Figure shows that for various work function examples, an improved and more uniform on current is achieved according to embodiments of the present disclosure. FIG. 9 shows the drain induced barrier lowering (DIBL) (in millivolts/volt) as a function of work function from the midgap of the device (in electron volts ev) for four different example devices. The Figure shows that for various work function examples, an improved and lower DIBL can be achieved by creating a more uniform leakage current profile along a cross-section of a semiconductor device which further results in less leakage current and improved device gate control.

As shown by the various configurations and embodiments illustrated in FIGS. 1-9, various improved multi-gate semiconductor devices have been described.

One embodiment provides a multi-gate semiconductor device including a semiconductor substrate and a first transistor including a first fin portion extending above the semiconductor substrate. The first transistor has a first channel region formed therein. The first channel region includes a first channel region portion doped at a first concentration of a first dopant type and a second channel region portion doped at a second concentration of the first dopant type. The second concentration is higher than the first concentration. The first transistor further includes a first gate electrode layer formed over the first channel region.

Another embodiment provides a multi-gate semiconductor device including a semiconductor substrate and a transistor including a fin portion extending above the semiconductor substrate. The transistor has a channel region of a first dopant type formed therein. The channel region has first and second channel region portions. The transistor also includes a gate electrode layer of the second dopant type formed over the channel region of the transistor. The multi-gate semiconductor device also includes a source region of the second dopant type, a drain region of the second dopant type and a first lightly doped drain (LDD) implant region of the second dopant type formed between the source region and the drain region and between the channel region of the transistor and the gate electrode layer. The first and second channel region portions of the channel region have different gate lengths.

A further embodiment provides a multi-gate semiconductor device including a semiconductor substrate and a transistor including a fin portion extending above the semiconductor substrate. The transistor has a channel region formed therein. The channel region includes a top channel region portion doped at a first concentration of a first dopant type and a bottom channel region portion doped at a second concentration of a second dopant type. The second concentration is higher than the first concentration. The transistor also includes a gate electrode layer of a first dopant type formed over the channel region of the transistor.

While preferred embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. It will be apparent to those skilled in the art that various modifications and variations can be made in the methods of the present subject matter without departing from the spirit and scope of the disclosure. Thus, it is intended that the claims cover the variations and modifications that may be made by those of ordinary skill in the art.

What we claim is:

1. A multi-gate semiconductor device, comprising:
a semiconductor substrate;
a transistor including a fin extending above a first portion of the semiconductor substrate, the fin having a first channel region formed therein, the first channel region comprising:
    a first channel region portion at a topmost portion of the first channel region and doped at a first concentration of a N-dopant type; and
    a second channel region portion below the first channel region portion and doped at a second concentration of the N-dopant type, wherein the second concentration is higher than the first concentration;
the transistor further comprising:
    a first gate electrode layer formed over the first channel region of the fin wherein the first gate electrode layer is of a P-dopant type;
    the fin having a second channel region formed therein, the second channel region comprising:
        a third channel region portion at a topmost portion of the second channel region and doped at a third concentration of a P-dopant type; and
        a fourth channel region portion below the first channel region portion and doped at a fourth concentration of the P-dopant type, wherein the fourth concentration is higher than the third concentration; and
    a second gate electrode layer formed over the second channel region of the fin wherein the second gate electrode layer is of the N-dopant type; and
    wherein the respective difference between the first concentration and the second concentration, and between the third concentration and the fourth concentration, is approximately $2e^{18}$ charge carriers per cubic centimeter or more.

2. The multi-gate semiconductor device of claim 1, further comprising:
a dielectric material layer formed over at least the first channel region of the fin, wherein the first gate electrode layer is formed over the dielectric material layer.

3. The multi-gate semiconductor device of claim 1, wherein the first channel region comprises at least one of a Ge, SiGe or III-V semiconductor material.

4. The multi-gate semiconductor device of claim 1, the transistor further comprising:
a source region of the N-dopant type;
a drain region of the N-dopant type;
a first lightly doped drain (LDD) implant region of the N-dopant type formed between the source region and a first sidewall of the first channel region; and
a second LDD implant region of the N-dopant type formed between the drain region and a second sidewall of the first channel region.

5. The multi-gate semiconductor device of claim 4, wherein the first channel region portion and the second channel region portion of the first channel region have a substantially uniform gate length.

6. The multi-gate semiconductor device of claim 1, wherein the first channel region portion is formed along an upper surface of the fin.

7. The multi-gate semiconductor device of claim 1, wherein the third channel region portion is formed along an upper surface of the fin.

8. A multi-gate semiconductor device, comprising:
a semiconductor substrate;
a transistor including a fin extending above the semiconductor substrate, the fin having a first channel region of a first dopant type formed therein, the first channel region further comprising first and second channel region portions having different gate lengths, wherein the gate length of the first channel region portion is shorter than the gate length of the second channel region portion, and wherein the first channel region portion is formed over the second channel region portion;

the transistor further comprising a first gate electrode layer of a second dopant type formed over the channel region of the fin;

the fin having a second channel region formed therein, the second channel region comprising:
 a third channel region portion doped at a first concentration of the second dopant type; and
 a fourth channel region portion doped at a second concentration of the second dopant type, wherein the second concentration is higher than the first concentration; and
a second gate electrode layer of the first dopant type formed over the second channel region of the fin;
a source region of the second dopant type;
a drain region of the second dopant type;
a first lightly doped drain (LDD) implant region of the second dopant type formed between the source region and the drain region and between the first channel region of the transistor and the first gate electrode layer.

9. The multi-gate semiconductor device of claim 8, further comprising:
 a second LDD implant region of the second dopant type formed between the source region and a sidewall of the first channel region portion; and
 a third LDD implant region of the second dopant type formed between the source region and a sidewall of the second channel region portion, wherein the second and third LDD implant regions have different gate lengths.

10. The multi-gate semiconductor device of claim 9, further comprising:
 a fourth LDD implant region of the second dopant type formed between the drain region and a second sidewall of the first channel region portion; and
 a fifth LDD implant region of the second dopant type formed between the drain region and a second sidewall of the second channel region portion, wherein the fourth and fifth LDD implant regions have different gate lengths.

11. The multi-gate semiconductor device of claim 8, wherein the first dopant type is P-type and the second dopant type is N-type and wherein the fourth channel region portion is formed over the third channel region portion.

12. The multi-gate semiconductor device of claim 8, wherein the difference between the third concentration and the fourth concentration is approximately $2e^{18}$ charge carriers per cubic centimeter or more.

13. A multi-gate semiconductor device, comprising:
 a semiconductor substrate;
 a transistor including a fin extending above the semiconductor substrate, the fin having a first channel region formed therein, the first channel region comprising:
  a first channel region portion at a topmost portion of the first channel region and doped at a first concentration of a first dopant type; and
  a second channel region portion below the first channel region portion and doped at a second concentration of a second dopant type, wherein the second concentration is higher than the first concentration; and
 the transistor further comprising:
  a first gate electrode layer of a first dopant type formed over the first channel region of the fin;
  the fin having a second channel region formed therein, the second channel region comprising:
   a third channel region portion at a topmost portion of the first channel region and doped at a third concentration of the first dopant type; and
   a fourth channel region portion below the first channel region portion and doped at a fourth concentration of the first dopant type, wherein the third concentration is different than the fourth concentration; and
  a second gate electrode layer of a second dopant type formed over the second channel region of the fin.

14. The multi-gate semiconductor device of claim 13, wherein the first dopant type is N-type and the second dopant type is P-type; and wherein the third concentration is higher than the fourth concentration.

15. The multi-gate semiconductor device of claim 13, wherein the respective difference between the first concentration and the second concentration, and between the third concentration and the fourth concentration, is approximately $2e^{18}$ charge carriers per cubic centimeter or more.

16. The multi-gate semiconductor device of claim 13, wherein the first channel region portion is formed along an upper surface of the fin.

17. The multi-gate semiconductor device of claim 13, wherein the third channel region portion is formed along an upper surface of the fin.

18. The multi-gate semiconductor device of claim 13, further comprising:
 a dielectric material layer formed over at least the first channel region, wherein the first gate electrode layer is formed over the dielectric material layer.

19. The multi-gate semiconductor device of claim 13, wherein the first channel region comprises at least one of a Ge, SiGe or III-V semiconductor material.

20. The multi-gate semiconductor device of claim 13, wherein the first channel region portion and the second channel region portion of the first channel region have a substantially uniform gate length and wherein the third channel region portion and the fourth channel region portion of the second channel region have a substantially uniform gate length.

* * * * *